(12) United States Patent
Chen

(10) Patent No.: US 8,896,289 B2
(45) Date of Patent: Nov. 25, 2014

(54) CIRCUIT AND METHOD OF SIGNAL DETECTION

(75) Inventor: Wei Chih Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 208 days.

(21) Appl. No.: 13/475,813

(22) Filed: May 18, 2012

(65) Prior Publication Data

US 2013/0307525 A1    Nov. 21, 2013

(51) Int. Cl.
*H03K 5/22* (2006.01)
*H03L 5/00* (2006.01)
*G01R 17/10* (2006.01)
*H04L 12/861* (2013.01)

(52) U.S. Cl.
CPC ............... *H04L 49/90* (2013.01); *G01R 17/10* (2013.01)
USPC ............................. 324/101; 327/65; 327/333

(58) Field of Classification Search
CPC ................................. H04L 49/90; G01R 17/10
USPC ....................................... 324/101; 327/65, 333
See application file for complete search history.

(56) References Cited

U.S. PATENT DOCUMENTS 7,646,227 B2 *    1/2010    Liu ............................... 327/159

\* cited by examiner

*Primary Examiner* — Melissa Koval
*Assistant Examiner* — Farhana Hoque
(74) *Attorney, Agent, or Firm* — Lowe Hauptman & Ham, LLP

(57) ABSTRACT

A circuit includes an input stage, a comparison stage, and a calibration stage. The input stage is configured to receive a first input signal, to generate a first reference signal, and to generate a second reference signal. The comparison stage is configured to generate a first comparison output signal in response to the first reference signal and a third reference signal and to generate a second comparison output signal in response to the second reference signal and a fourth reference signal. The calibration stage is configured to generate a detection signal responsive to the presence of the first comparison output signal and the second comparison output signal having a signal frequency within a predetermined frequency band.

21 Claims, 5 Drawing Sheets

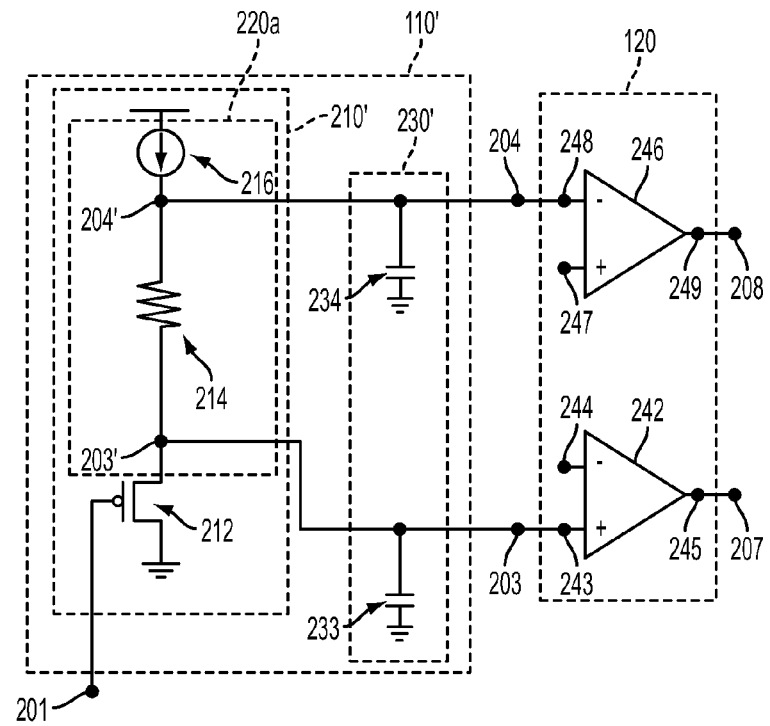
FIG. 2B
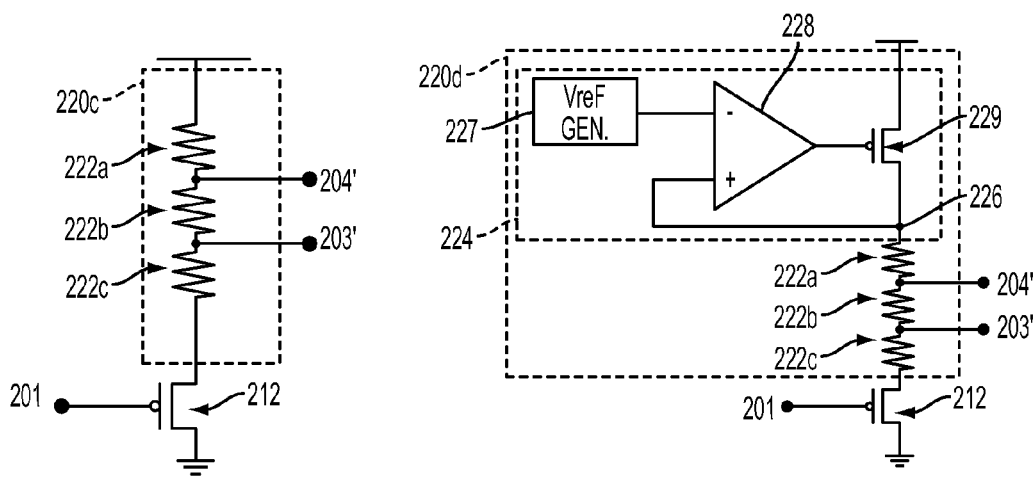
FIG. 2C
FIG. 2D

CIRCUIT AND METHOD OF SIGNAL DETECTION

BACKGROUND

A communication interface between two electrical components, such as between a processor and a storage device, may be arranged in a manner that is operable in accordance with at least a lower speed transmission protocol and a higher speed transmission protocol. Each of the lower speed transmission protocol and the higher speed transmission protocol may have different requirements with regard to signal frequency, signal swing, and/or coding/decoding scheme. In some applications, the communication interface uses the lower speed transmission protocol for transmitting control signals and handshake signals and uses the higher speed transmission protocol for transmitting user data.

For example, in a USB 3.0 interface, user data is transmitted according to a transmission protocol having a signal frequency ranging from 0.5 GHz to 2.5 GHz. Also, in the USB 3.0 interface, control signals for initializing communication and power management are transmitted using a Low Frequency Periodic Signaling (LFPS) protocol having a signal frequency ranging from 10 MHz to 50 MHz.

DESCRIPTION OF THE DRAWINGS

One or more embodiments are illustrated by way of examples, and not by limitation, in the figures of the accompanying drawings, wherein elements having the same reference numeral designations represent like elements throughout and wherein:

FIG. 2B is a schematic diagram of another example circuit including an input stage and a comparison stage in accordance with one or more embodiments;

FIG. 2C is a schematic diagram of a source follower and an example reference voltage generation unit usable in the input stage depicted in FIG. 2A or FIG. 2B;

FIG. 2D is a schematic diagram of a source follower and another example reference voltage generation unit usable in the input stage depicted in FIG. 2A or FIG. 2B;

DETAILED DESCRIPTION

Figure 1:
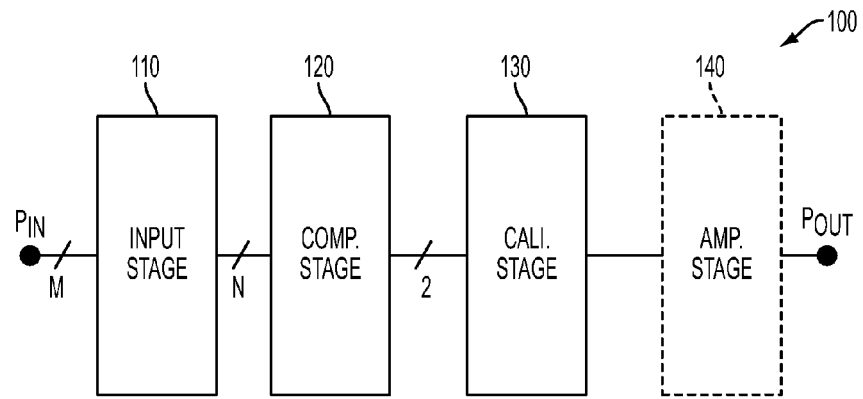
FIG. 1 is a system block diagram of a signal detection circuit in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure describes, among other things, a signal detection circuit configured to detect the presence of an input signal having a signal frequency within a predetermined frequency band and a signal swing greater than a predetermined voltage level. In some embodiments, the signal detection circuit generates two reference signals that are separated apart by the predetermined voltage level, and then a detection signal is generated based on the reference signals and the predetermined frequency band.

FIG. 1 is a system block diagram of a signal detection circuit 100 in accordance with one or more embodiments. The signal detector 100 includes an input stage 110 coupled to an input port $P_{IN}$ that is configured to receive M signals and to generate N reference signals, a comparison stage 120 coupled to the input stage 110 and configured to receive the N reference signals, a calibration stage 130 coupled between the comparison stage 120 and an output port $P_{OUT}$, and optionally an amplification stage 140 coupled between the calibration stage 130 and the output port $P_{OUT}$. M and N are positive integers. In some embodiments, the signal detection circuit 100 is part of a receiving unit in an electrical device. The signal detection circuit 100 provides a detection signal at the output port $P_{OUT}$ for the receiving unit in order to determine an operation mode, a power mode, and/or a coding/decoding scheme of the receiving unit.

The input stage 110 receives M input signals from the input port $P_{IN}$ and generates N reference signals based on the received M input signals, the predetermined voltage level from which signal swing of the M input signals to be compared with, and optionally the predetermined frequency band of the M input signals. The comparison stage 120 generates comparison two output signals based on the N reference signals, and the calibration stage 130 generates the detection signal based on the two comparison output signals.

In some embodiments, M equals one and N equals two, the input port $P_{IN}$ receives a single-ended input signal, and the detection circuit 100 is usable to generate a detection signal that is indicative of (1) a signal swing of the single-ended signal being greater than the predetermined voltage level, and (2) a signal frequency of the single-ended signal being within the predetermined frequency band. In some embodiments, M equals two and N equals four, the input port $P_{IN}$ receives a pair of differential signals, and the detection signal is indicative of (1) a total signal swing of the pair of differential signals being greater than twice the predetermined voltage level, and (2) a signal frequency of the pair of differential signals being within the predetermined frequency band.

In some embodiments, the signal detection circuit 100 further includes the amplification stage 140 configured to shape the detection signal to have a sufficient signal swing and driving capability for feeding the detection signal to the other portion(s) of the receiving unit or the electrical device that is equipped with the detection circuit 100.

Figure 2A:
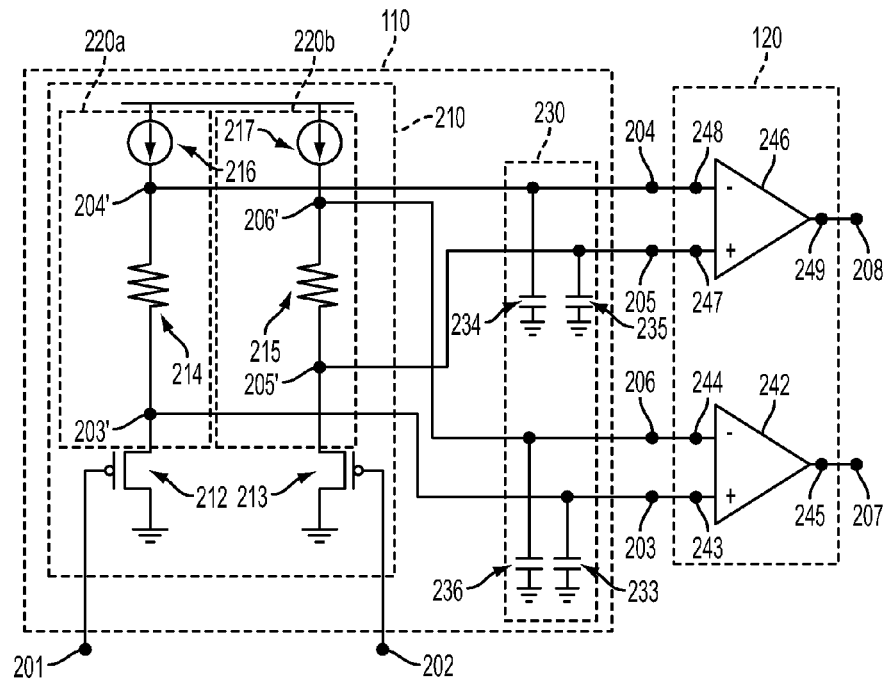
FIG. 2A is a schematic diagram of an example circuit including an input stage and a comparison stage in accordance with one or more embodiments.

FIG. 2A is a schematic diagram of an example circuit including an input stage 110 and a comparison stage 120 in accordance with one or more embodiments. In some embodiments, the circuit depicted in FIG. 2A is usable for a pair of differential input signals. The input stage 110 includes a first input node 201, a second input node 202, a first output node 203, a second output node 204, a third output node 205, and a fourth output node 206. The comparison stage 120 includes four input nodes each coupled to one of the first, second, third, and fourth output nodes 203, 204, 205, and 206. The comparison stage 120 also includes a first output node 207 and a second output node 208.

The input stage 110 includes a reference signal generator 210 and a band limiting unit 230 coupled to the reference signal generator 210. The reference signal generator 210 is coupled to the first and second input nodes 201 and 202 and includes a first output node 203', a second output node 204', a third output node 205', and a fourth output node 206'. In the embodiment depicted in FIG. 2A, the first input node 201 and the second input node 202 are coupled to the input port $P_{IN}$. The reference signal generator 210 receives a first input signal at the first input node 201 and receives a second input signal at the second input node 202. The first input signal and the second input signal being a pair of differential signals.

The reference signal generator 210 generates a first reference signal at the first output node 203' by level shifting the first input signal by a first predetermined voltage level; generates a second reference signal at the second output node 204' by level shifting the first reference signal by a second predetermined voltage level; generates a third reference signal at the third output node 205' by level shifting the second input signal by the first predetermined voltage level; and generates a fourth reference signal at the fourth output node 206' by level shifting the third reference signal by the second predetermined voltage level.

In the embodiment depicted in FIG. 2A, the reference signal generator 210 includes a first source follower circuit 212, a second source follower circuit 213, a first reference voltage generation unit 220a including a first resistor 214 and a first current source 216, and a second reference voltage generation unit 220b including a second resistor 215 and a second current source 217.

The first source follower circuit 212 has an input node coupled to the first input node 201 and an output node coupled to the first output node 203'. The first resistor 214 has a first end coupled to the output node of the first source follower circuit 212 at the first output node 203'. The first resistor 214 also has a second end coupled to the second output node 204'. The first current source 216 is coupled to the second end of the first resistor 214 at the second output node 204'.

In some embodiments, the first source follower circuit 212 generates the first reference signal at the first output node 203' by level shifting the first input signal by the first predetermined voltage level. In some embodiments, the first source follower circuit 212 is a metal-oxide semiconductor field effect transistor (MOSFET, or MOS transistor), and the first predetermined voltage level is set based on the characteristics of the MOS transistor and a biasing current provided by the first current source 216. In some embodiments, the first resistor 214 generates the second reference signal at the second output node 204' by level shifting the first reference signal by the second predetermined voltage level. In some embodiments, the second predetermined voltage level is set based on a resistance value of the first resistor 214 and the biasing current provided by the first current source 216.

The second source follower circuit 213, the second resistor 215, and the second current source 217 are arranged to match the configuration of the first source follower 212, the first resistor 215, and the first current source 216. For example, the second source follower circuit 213 has an input node coupled to the second input node 202 and an output node coupled to the third output node 205'. The second resistor 215 has a first end coupled to the output node of the first source follower circuit 213 at the third output node 205'. The second resistor 215 also has a second end coupled to the fourth output node 206'. The second current source 217 is coupled to the second end of the second resistor 215 at the fourth output node 206'.

In some embodiments, the second source follower circuit 213 generates the third reference signal at the third output node 205' by level shifting the second input signal by the first predetermined voltage level. In some embodiments, the second source follower circuit 213 is a MOS transistor, and the first predetermined voltage level is set based on the characteristics of the MOS transistor and a biasing current provided by the second current source 217. In some embodiments, the second resistor 215 generates the fourth reference signal at the fourth output node 206' by level shifting the third reference signal by the second predetermined voltage level. In some embodiments, the second predetermined voltage level is set based on a resistance value of the second resistor 215 and the biasing current provided by the second current source 217.

The second predetermined voltage level is usable as a threshold voltage level of the signal swing from which the first and the second input signals is compared. In some embodiments, the first predetermined voltage level ranges from 25 mV to 300 mV, and the second predetermined voltage level ranges from 75 mV to 125 mV. In at least one embodiment, the second predetermined voltage level is about 100 mV, the first and second current sources 216 and 217 each generate a current having a current level of about 100 µA, and the first and second resistors 214 and 215 each have a resistance value of about 1 kΩ.

The band limiting unit 230 is coupled to the first, second, third, and fourth output nodes 203, 204, 205, and 206 of the input stage 110 and the first, second, third, and fourth output nodes 203', 204', 205', and 206' of the reference signal generator 210. The band limiting unit 230 suppresses out-of-band components from the first, second, third, and fourth reference signals according to the predetermined frequency band. In some embodiments, the band limiting unit 230 is a low-pass filter having a 3 dB cut-off frequency ranging from 50 MHz to 100 MHz. In the embodiment depicted in FIG. 2A, the filtering unit 230 includes capacitors 233, 234, 235, and 236 each coupled to corresponding nodes 203, 204, 205, and 206. In some embodiments, the capacitors 233, 234, 235, and 236 each include a MOS transistor configured as a capacitor.

In some embodiments, the band limiting unit 230 is a band-pass filter. In some embodiments, the band limiting unit 230 is omitted. In some embodiments, a pass band of the band limiting unit 230 is adjusted to be operable for suppressing the frequency components not compatible with a predetermined communication protocol.

The comparison stage 120 includes a first comparator 242 and a second comparator 246. The first comparator 242 has a positive input node 243, a negative input node 244, and an output node 245. The positive input node 243 is coupled to the first output node 203 of the input stage 110, which in turn is coupled to the first end (node 203') of the first resistor 214. The negative input node 244 is coupled to the fourth output node 206 of the input stage 110, which in turn is coupled to the second end (node 206') of the second resistor 215. The second comparator 246 has a positive input node 247, a negative input node 248, and an output node 249. The positive input node 247 is coupled to the third output node 205 of the input stage 110, which in turn is coupled to the first end (node 205')

of the second resistor 215. The negative input node 248 is coupled to the second output node 204 of the input stage 110, which in turn is coupled to the second end (node 204') of the first resistor 214. The output node 245 of the first comparator 242 is coupled to the first output node 207 of the comparison stage 120, and the output node 249 of the second comparator 246 is coupled to the second output node 208 of the comparison stage 120.

The comparison stage 120 generates a first comparison output signal at the first output node 207 of the comparison stage 120 by comparing the first reference signal with the third reference signal, and generates a second comparison output signal at the second output node 208 of the comparison stage 120 by comparing the second reference signal with the fourth reference signal. In some embodiments, the first comparison output signal has either a logic high level or a logic low level in response to if the first reference signal has a voltage level greater than that of the third reference signal. In some embodiments, the second comparison output signal has either the logic high level or the logic low level in response to if the second reference signal has a voltage level greater than that of a fourth reference signal.

Therefore, after level-shifting the input signals at input nodes 201 and 202, if the total signal swing of the pair of differential signals at input nodes 201 and 202 is greater than twice the second predetermined voltage level, the reference signals at output nodes 203 and 206 cross over each other at a frequency equal to the signal frequency of the input signals at input nodes 201 and 202. The reference signals at output nodes 203 and 206 also cross over each other at the frequency equal to the signal frequency of the input signals at input nodes 201 and 202. As a result, the comparison output signals at output nodes 207 and 208 are alternating current (AC) signals having a signal frequency equal to the signal frequency of the input signals at input nodes 201 and 202.

FIG. 2B is a schematic diagram of another example circuit including an input stage 110' and a comparison stage 120 in accordance with one or more embodiments. In some embodiments, the circuit depicted in FIG. 2B is usable for a single-ended input signal. Compared with the embodiment depicted in FIG. 2A, the embodiment depicted in FIG. 2B has only one input node 201. Accordingly, the source follower 213, the resistor 215, and the current source 217 in the signal generator 210 are omitted in the signal generator 210', and the capacitors 235 and 236 in the filtering unit 230 are omitted in the filtering unit 230'. The third reference signal at node 244 and the fourth reference signal at node 247 are set at a value equal to a direct current (DC) voltage matching an average value of the DC component of the first reference signal at node 203 and the DC component of the second reference signal at node 204. In some embodiments, for a single-ended application, the third and fourth reference signals are generated by a reference voltage generation circuit or a voltage dividing circuit including resistors connected in series.

Therefore, after level-shifting input signals at input node 201, if the signal swing of the input at input node 201 is greater than the second predetermined voltage level, the reference signals at nodes 203 and 244 cross over each other at a frequency equal to the signal frequency of the input signal at input node 201. The reference signals at nodes 204 and 247 also cross over each other at the frequency equal to the signal frequency of the input signal at input node 201. As a result, the comparison output signals at output nodes 207 and 208 are AC signals having a signal frequency equal to the signal frequency of the input signal at input node 201.

FIG. 2C is a schematic diagram of a source follower 212 and an example reference voltage generation unit 220c usable in the input stage 110 or 110' depicted in FIG. 2A or FIG. 2B as the reference voltage generation unit 220a and/or 220b. The reference voltage generation unit 220c includes at least three resistors 220a, 220b, and 220c connected in series. The resistor 222a is coupled between a positive power supply and the second output node 204', the resistor 222b is coupled between the first output node 203' and the second output node 204', and the third resistor 222c is coupled between are the first output node 203' and the source follower 212.

FIG. 2D is a schematic diagram of a source follower 212 and another example reference voltage generation unit 220d usable in the input stage 110 or 110' depicted in FIG. 2A or FIG. 2B as the reference voltage generation unit 220a and/or 220b. Compared with the reference voltage generation unit 220c in FIG. 2C, the reference voltage generation unit 220d further includes a biasing circuit 224 arranged between the positive power supply and the resistor 222a. The biasing circuit 224 keeps the voltage level at node 226 at a predetermined reference voltage level Vref. The biasing circuit 224 includes a Vref generator 227, an Operational Amplifier 228, and a source follower 229. The biasing circuit 224 generates a voltage signal having a voltage level equal to the predetermined reference voltage level Vref. The Operational Amplifier 228 and the source follower 229 forms a negative feedback loop that minors the voltage level at a negative input terminal of the Operational Amplifier 228 to a positive input terminal of the Operational Amplifier 228, which is coupled to the node 229.

Figure 3A:
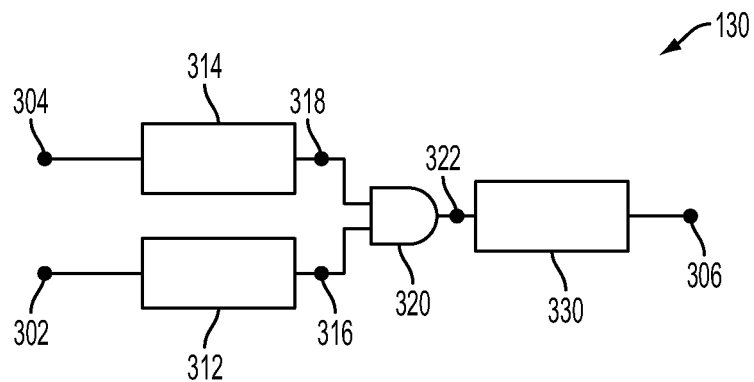
FIG. 3A is a system block diagram of a calibration stage in accordance with one or more embodiments.

FIG. 3A is a system block diagram of a calibration stage 130 in accordance with one or more embodiments. The calibration stage 130 has a first input node 302, a second input node 304, and an output node 306. The first input node 302 is coupled to the first output node 207 of the comparison stage 120, which in turn is coupled to the output node 245 of the first comparator 242. The second input node 304 is coupled to the second output node 208 of the comparison stage 120, which in turn is coupled to the output node 249 of the second comparator 246. The calibration stage 130 generates a detection signal at the output node 306 of the calibration stage 130 indicative of the presence of both (1) the first comparison output signal at the output node 245 of the first comparator 242 being an alternating current (AC) signal of a signal frequency within the predetermined frequency band; and (2) the second comparison output signal at the output node 249 of the second comparator 246 being an AC signal of a signal frequency within the predetermined frequency band.

In the embodiment depicted in FIG. 3A, the calibration stage 130 includes a first delay circuit 312, a second delay circuit 310, an AND gate 320, and a third delay circuit 330. In some embodiments, output node 306 of the calibration stage 130 is coupled to the output port $P_{OUT}$.

The first delay circuit 312 has an output node 316 and an input node coupled to the first input node 302. The second delay circuit 314 also has an output node 318 and an input node coupled to the second input node 304. The AND gate 320 has an output node 322 and two input nodes coupled to a corresponding one of the output nodes 316 and 318. The third delay circuit 330 has an input node coupled to the output node 322 of the AND gate 320, and an output node coupled to the output node 306 of the calibration stage 130.

In some embodiments, the first delay circuit 312 and the second delay circuit 314 each cause a first predetermined delay at the corresponding output node 316 or 318 in response to a falling edge signal at the corresponding input node 302 or 304, and cause a second predetermined delay at the corresponding output node 316 or 318 in response to a rising edge signal at the corresponding input node 302 or 304. In some embodiments, the first predetermined delay is greater than the second predetermined delay. In some embodiments, the first and second predetermined delays are set based on a lower bound of the predetermined frequency band.

In some embodiments, the third delay circuit 330 also causes a third predetermined delay at the output node of the third delay circuit 330 in response to a falling edge signal at the input node (i.e., output node 322 of the AND gate 320) of the third delay circuit 330, and causes a fourth predetermined delay at the output node in response to a rising edge signal at the input node (i.e., output node 322 of the AND gate 320). In some embodiments, the third predetermined delay is greater than the fourth predetermined delay. In some embodiments, the third and fourth predetermined delays are set based on a lower bound of the predetermined frequency band.

Figure 3B:
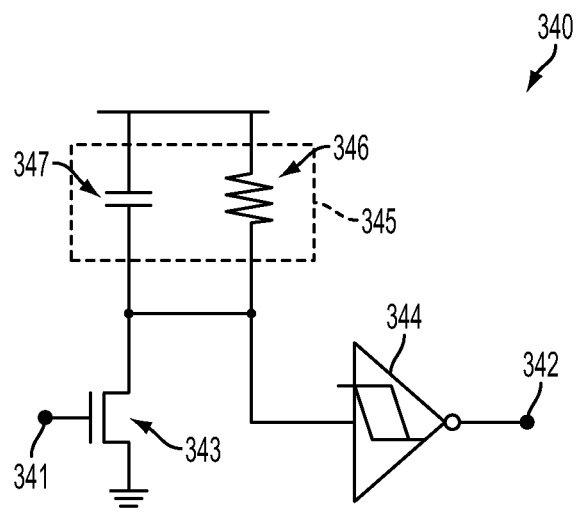
FIG. 3B is a schematic diagram of an example delay circuit usable in the calibration stage of FIG. 3A in accordance with one or more embodiments.

FIG. 3B is a schematic diagram of an example delay circuit 340 usable in the calibration stage 130 of FIG. 3A in accordance with one or more embodiments. The delay circuit 340 includes an input node 341 and an output node 342. The delay circuit 340 also includes an N-channel MOS transistor (NMOS transistor), a Smith trigger device 344, and an RC network 345. The NMOS transistor 343 has a gate terminal coupled to the input node 341 of the delay circuit 340, a drain terminal, and a source terminal coupled to a ground. The Smith trigger device 344 has an input node coupled to the drain terminal of the NMOS transistor 343, and an output node coupled to the output node 342 of the delay circuit 340. The RC network 345 is coupled to the drain terminal of the NMOS transistor 343. The RC network 345 includes at least one resistor 346 and a capacitor 347. The RC network 345 and the NMOS transistor 343 are set to provide the predetermined delays in response to a falling edge signal and a rising edge signal at the input node 341 of the delay circuit 340.

Figure 4:
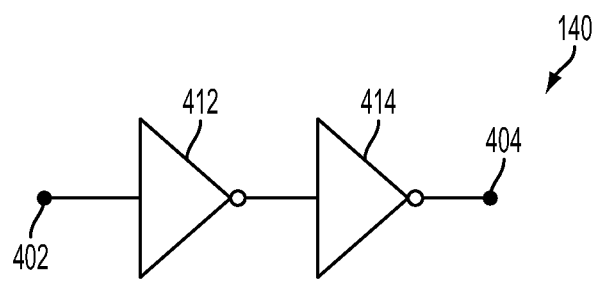
FIG. 4 is a schematic diagram of an example amplification stage in accordance with one or more embodiments.

FIG. 4 is a schematic diagram of an example amplification stage 140 in accordance with one or more embodiments. In some embodiments, the amplification stage 140 is coupled between the calibration stage 130 (FIG. 1) and the output port $P_{OUT}$ (FIG. 1). The amplification stage 140 includes an input node 402, an output node 404, and one or more inverters 412 and 414 connected in series between the input node 402 and the output node 404. In some embodiments, the input node 402 is coupled to the output node 306 of the calibration stage 130 (FIG. 3A). In some embodiments where the third delay circuit 330 (FIG. 3A) has sufficient driving capability, the amplification stage 140 is omitted.

Figure 5:
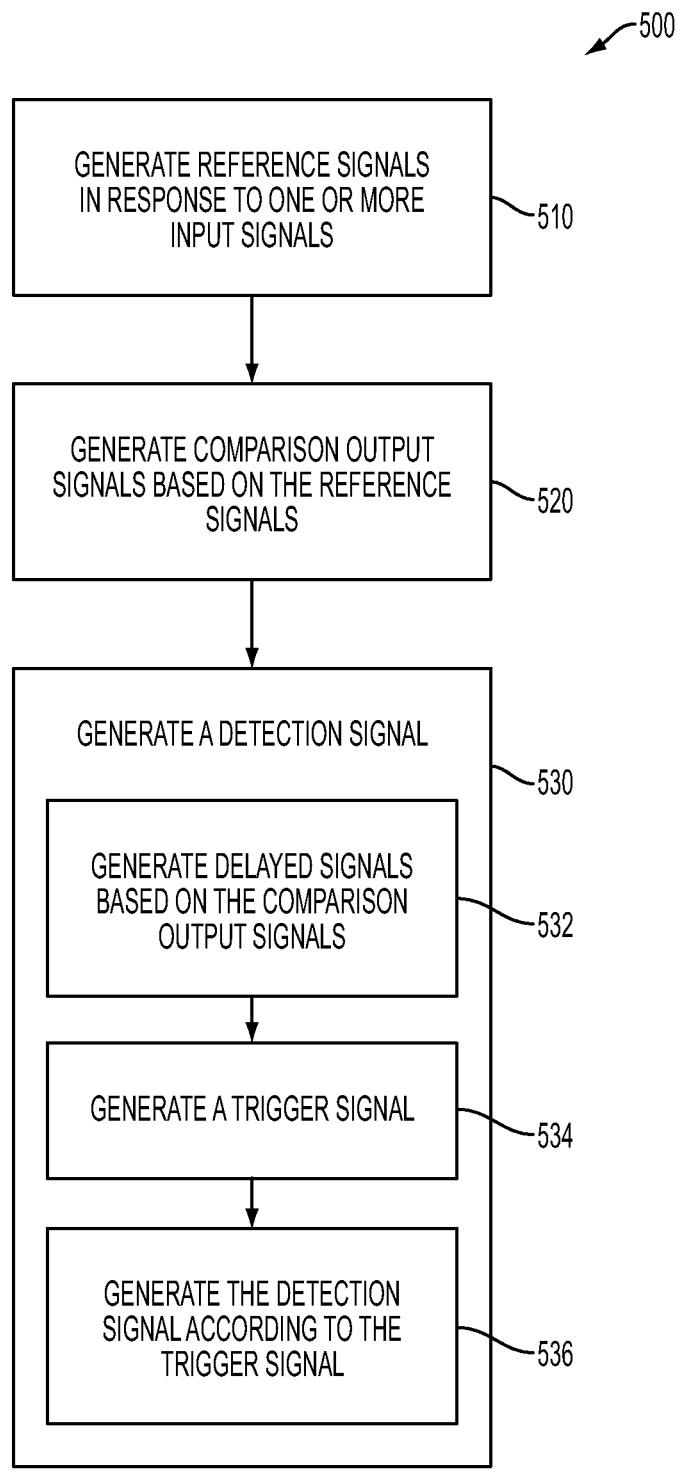
FIG. 5 is a flowchart of a method of signal detection in accordance with one or more embodiments.
Figure 6:
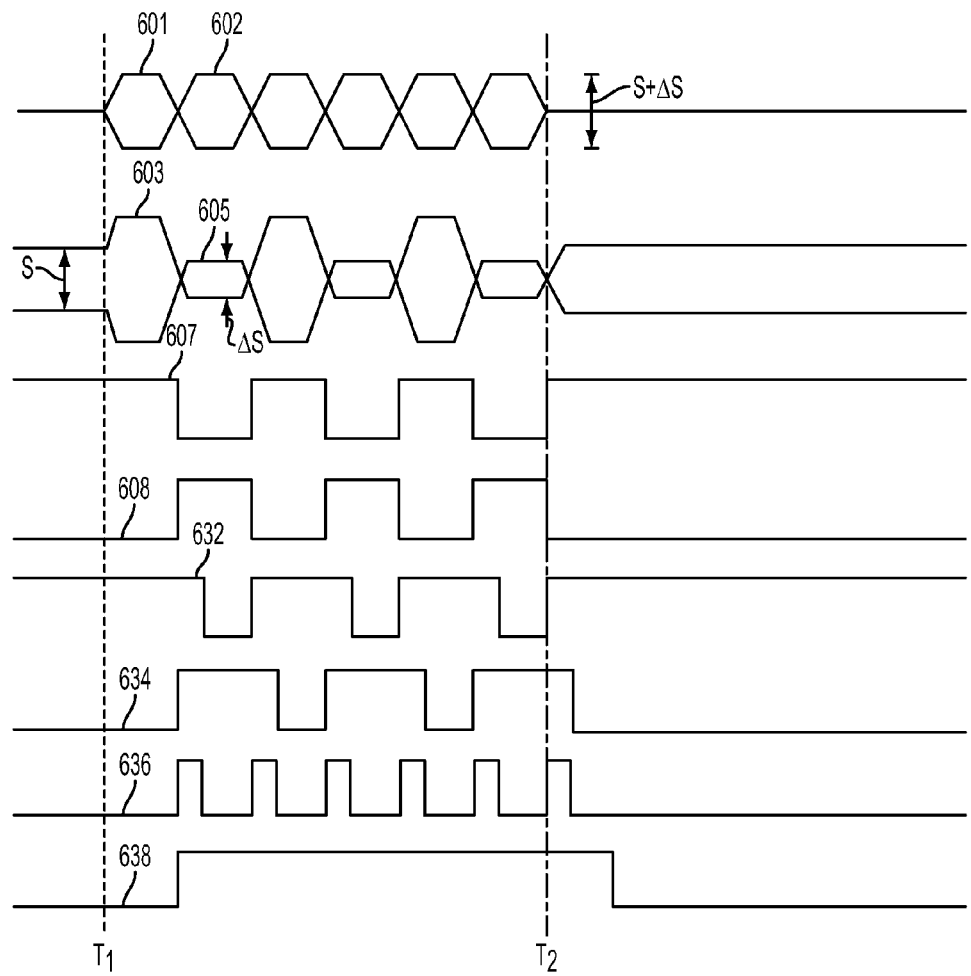
FIG. 6 is a chart of signals at various nodes in a circuit including the input stage and the comparison stage depicted in FIG. 2A and the calibration stage depicted in FIGS. 3A and 3B in accordance with one or more embodiments.

FIG. 5 is a flowchart of a method 500 of signal detection in accordance with one or more embodiments. FIG. 6 is a chart of signals at various nodes in a circuit including at least the input stage 110 and the comparison stage 120 depicted in FIG. 2A and the calibration stage 130 depicted in FIGS. 3A and 3B in accordance with one or more embodiments. It is understood that additional operations may be performed before, during, and/or after the method 500 depicted in FIG. 5, and that some other operations may only be briefly described herein.

In FIG. 6, signals 601 and 602 represent the signals at the input nodes 201 and 202 of the input stage 110; signals 603 and 605 represent the signals at the output nodes 203 and 205 of the input stage 110; signal 607 represents the signal at the output node 207 of the comparison stage 120, signal 608 represents the signal at the output node 208 of the comparison stage 120; signal 632 represents the signal at the node 316 of the calibration stage 130; signal 634 represents the signal at the node 318 of the calibration stage 130; signal 636 represents the signal at the node 322 of the calibration stage 130; and signal 638 represents the signal at the node 306 of the calibration stage 130.

As depicted in FIG. 6, between time $T_1$ and $T_2$, a pair of differential input signals 601 and 602 at the input nodes 201 and 202 has a signal swing S+ΔS individually. In other words, the pair of differential input signals 601 and 602 collectively has a total signal swing of 2(S+ΔS). S represents the predetermined voltage level with which the input signals 601 and 602 are to be compared, and the notation "S+ΔS" is used denote that the input signals 601 and 602 each have a signal swing greater than the predetermined voltage level for an amount of ΔS.

As depicted in FIGS. 5, 6, and 2A, in operation 510, the first, second, third, and fourth reference signals, such as signals 603 and 605, are generated according to the input signals 601 and 602. For example, the reference signal 605 is generated by level shifting the input signal 602 by a first predetermined voltage level determined by the source follower 213, and the reference signal 603 is generated by level shifting the input signal 601 by the first predetermined voltage level determined by the source follower 212 and a second predetermined voltage level determined by the resistor 214. The second predetermined voltage level equals the predetermined voltage level S. Therefore, as depicted in FIG. 6, the DC component of the reference signal 603 and the DC component of the reference signal 605 are separated apart by the predetermined voltage level S.

As depicted in FIGS. 5, 6, and 2A, in operation 520, comparison output signals 607 and 608 are generated based on the reference signals, such as signals 603 and 605. Because the input signals 601 and 602 have a signal swing greater than the predetermined voltage level S (i.e., the input signals 601 and 602 collectively have a total signal swing greater than twice the predetermined voltage level (2S)), the reference signals 603 and 605 cross over each other alternatively at a frequency equal to the signal frequency of the input signals 601 and 602. Therefore, comparison output signals 607 and 608 are AC signals between time $T_1$ and $T_2$. In at least one embodiment, the comparison output signals 607 and 608 have a 180-degree phase difference. On the other hand, prior to time $T_1$ and after time $T_2$, the input signals 601 and 602 do not have a signal swing greater than the predetermined voltage level S. Thus, the signals 601 and 602 does not cross over each other. As a result, one of the comparison output signals 607 and 608 remains at logic high, and the other one remains at logic low. In some embodiments, during a time period between time $T_1$ and $T_2$, if the signal swing of the input signals 601 and 602 is less than the predetermined voltage level S, the reference signals 603 and 605 does not cross over each other as well.

As depicted in FIGS. 5, 6, and 2A, in operation 530, a detection signal 638 in generated according to the comparison output signals 607 and 608. The operation 530 further includes, in operation 532, generate delayed signals 632 and 634 according to comparison output signals 607 and 608 in order to create overlapped portions between delayed signals 632 and 634. Then, in operation 534, a trigger signal 636 having a pulse train waveform is generated by performing an ADD operation based on the overlapped portions of the delayed signals 632 and 634. Finally, in operation 536, the detection signal 638 is generated by delaying the trigger signal 636 in order to convert the pulse train waveform into a steady logic high or logic low signal indicative of the presence or absence of input signals meeting the requirements for the predetermined frequency band and predetermined signal swing.

In accordance with some embodiments, a circuit includes an input stage, a comparison stage, and a calibration stage. The input stage has a first input node, a first output node, and a second output node. The input stage is configured to generate a first reference signal at the first output node of the input stage, and to generate a second reference signal at the second output node of the input stage. The comparison stage has a first input node, a second input node, a first output node, and a second output node. The first input node of the comparison stage is coupled to the first output node of the input stage, and the second input node of the comparison stage is coupled to the second output node of the input stage. The comparison stage is configured to generate a first comparison output signal at the first output node of the comparison stage in response to the first reference signal and a third reference signal and to generate a second comparison output signal at the second output node of the comparison stage in response to the second reference signal and a fourth reference signal. The calibration stage is coupled to the comparison stage. The calibration stage is configured to generate a detection signal responsive to the presence of (1) the first comparison output signal being an alternating current (AC) signal having a signal frequency within a first predetermined frequency band; and (2) the second comparison output signal being an AC signal having a signal frequency within the first predetermined frequency band.

In accordance with some embodiments, a circuit includes a first source follower circuit, a first resistor, a first comparator, a second comparator, and a calibration stage. The first source follower circuit has an input node and an output node. The first resistor has a first end and a second end, and the first end of the first resistor is coupled to the output node of the first source follower circuit. The first comparator has a negative input node, a positive input node, and an output node. The positive input node of the first comparator is coupled to the first end of the first resistor. The second comparator has a negative input node, a positive input node, and an output node. The negative input node of the second comparator being coupled to the second end of first the resistor. The calibration stage has a first input node, a second input node, and an output node. The first input node of the calibration stage is coupled to the output node of the first comparator, and the second input node of the calibration stage is coupled to the output node of the second comparator. The calibration stage is configured to generate a detection signal at the output terminal of the calibration stage responsive to the presence of (1) a first comparison output signal at the output node of the first comparator has a signal frequency within a predetermined frequency band; and (2) a second comparison output signal at the output node of the second comparator has a signal frequency within the predetermined frequency band.

In accordance with some embodiments, a method of detecting if an input signal having a signal swing greater than a first predetermined voltage level and a signal frequency within a predetermined frequency band includes generating a first reference signal at a first node of an input stage and generating a second reference signal at the second node of the input stage. A first comparison output signal is generated in response to the first reference signal and a third reference signal. A second comparison output signal is generated in response to the second reference signal and a fourth reference signal. A detection signal is generated after the first comparison output signal and second comparison output signal each has a signal frequency within the predetermined frequency band.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   an input stage having a first input node, a first output node, and a second output node, the input stage being configured to:
      generate a first reference signal at the first output node of the input stage; and
      generate a second reference signal at the second output node of the input stage;
   a comparison stage having a first input node, a second input node, a first output node, and a second output node, the first input node of the comparison stage being coupled to the first output node of the input stage, and the second input node of the comparison stage being coupled to the second output node of the input stage, the comparison stage being configured to:
      generate a first comparison output signal at the first output node of the comparison stage in response to the first reference signal and a third reference signal; and
      generate a second comparison output signal at the second output node of the comparison stage in response to the second reference signal and a fourth reference signal; and
   a calibration stage coupled to the comparison stage and configured to generate a detection signal responsive to the presence of
      the first comparison output signal being an alternating current (AC) signal having a signal frequency within a predetermined frequency band; and
      the second comparison output signal being an AC signal having a signal frequency within the predetermined frequency band.

2. The circuit of claim 1, wherein the input stage further comprises a band limiting unit coupled to the first output node of the input stage and the second output node of the input stage.

3. The circuit of claim 1,
   wherein the input stage further comprises a second input node, a third output node, and a fourth output node, and the input stage is configured to:
      generate the third reference signal at the third output node of the input stage; and
      generate the fourth reference signal at the fourth output node of the input stage, and
   wherein the comparison stage further comprises a third input node and a fourth input node, the third input node of the comparison stage is coupled to the third output node of the input stage, and the fourth input node of the comparison stage is coupled to the fourth output node of the input stage.

4. The circuit of claim 3, wherein the input stage further comprises a band limiting unit coupled to the first output node of the input stage, the second output node of the input stage, the third output node of the input stage, and the fourth output node of the input stage.

5. The circuit of claim 1, wherein the calibration stage comprises:
   a first delay circuit having an input node and an output node, the input node of the first delay circuit coupled to the first output node of the comparison stage;

a second delay circuit having an input node and an output node, the input node of the second delay circuit coupled to the second output node of the comparison stage;

an AND gate having two input nodes and an output node, each of the two input nodes of the AND gate coupled to a corresponding one of the output node of the first delay circuit and the output node of the second delay circuit; and a third delay circuit having an input node and an output node, the input node of the third delay circuit coupled to the output node of the AND gate.

6. The circuit of claim 5, wherein the first delay circuit and the second delay circuit each is configured to:
cause a first predetermined delay at the corresponding output node in response to a falling edge signal at the corresponding input node; and
cause a second predetermined delay at the corresponding output node in response to a rising edge signal at the corresponding input node, the first predetermined delay being greater than the second predetermined delay.

7. The circuit of claim 5, wherein the first delay circuit and the second delay circuit each comprises:
an NMOS transistor having a gate terminal, a drain terminal, and a source terminal, the gate terminal of the NMOS transistor coupled to the corresponding input node of the corresponding delay circuit, and the source terminal of the NMOS transistor coupled to a ground;
a Smith trigger device coupled to the drain terminal of the NMOS transistor; and
an RC network coupled to the drain terminal of the NMOS transistor.

8. The circuit of claim 5, wherein the third delay circuit is configured to:
cause a third predetermined delay at the output node of the third delay circuit in response to a falling edge signal at the input node of the third delay circuit; and
cause a fourth predetermined delay at the output node of the third delay circuit in response to a rising edge signal at the input node of the third delay circuit, the third predetermined delay being greater than the fourth predetermined delay.

9. The circuit of claim 8, wherein the third delay circuit comprises:
an NMOS transistor having a gate terminal, a drain terminal, and a source terminal, the gate terminal of the NMOS transistor coupled to the input node of the third delay circuit, and the source terminal of the NMOS transistor coupled to a ground;
a Smith trigger device coupled to the drain terminal of the NMOS transistor; and
an RC network coupled to the drain terminal of the NMOS transistor.

10. A circuit, comprising:
a first source follower circuit having an input node and an output node;
a first resistor having a first end and a second end, the first end of the first resistor coupled to the output node of the first source follower circuit;
a first comparator having a negative input node, a positive input node, and an output node, the positive input node of the first comparator being coupled to the first end of the first resistor;
a second comparator having a negative input node, a positive input node, and an output node, the negative input node of the second comparator being coupled to the second end of first the resistor; and a calibration stage having a first input node, a second input node, and an output node, the first input node coupled to the output node of the first comparator, the second input node coupled to the output node of the second comparator, and the calibration stage being configured to generate a detection signal at the output terminal of the calibration stage responsive to the presence of
a first comparison output signal at the output node of the first comparator has a signal frequency within a predetermined frequency band; and
a second comparison output signal at the output node of the second comparator has a signal frequency within the predetermined frequency band.

11. The circuit of claim 10, wherein the calibration stage comprises:
a first delay circuit having an input node and an output node, the input node of the first delay circuit coupled to the output node of the first comparator;
a second delay circuit having an input node and an output node, the input node of the second delay circuit coupled to the output node of the second comparator;
an AND gate having two input nodes and an output node, each of the two input nodes of the AND gate coupled to a corresponding one of the output node of the first delay circuit and the output node of the second delay circuit; and
a third delay circuit having an input node and an output node, the input node of the third delay circuit coupled to the output node of the AND gate.

12. The circuit of claim 11, wherein the first delay circuit and the second delay circuit each is configured to:
cause a first predetermined delay at the corresponding output node in response to a falling edge signal at the corresponding input node; and
cause a second predetermined delay at the corresponding output node in response to a rising edge signal at the corresponding input node, the first predetermined delay being greater than the second predetermined delay.

13. The circuit of claim 12, wherein the first delay circuit and the second delay circuit each comprises:
an NMOS transistor having a gate terminal, a drain terminal, and a source terminal, the gate terminal of the NMOS transistor coupled to the corresponding input node of the corresponding delay circuit, and the source terminal of the NMOS transistor coupled to a ground;
a Smith trigger device coupled to the drain terminal of the NMOS transistor; and
an RC network coupled to the drain terminal of the NMOS transistor.

14. The circuit of claim 11, wherein the third delay circuit is configured to:
cause a third predetermined delay at the output node of the third delay circuit in response to a falling edge signal at the input node of the third delay circuit; and
cause a fourth predetermined delay at the output node of the third delay circuit in response to a rising edge signal at the input node of the third delay circuit, the third predetermined delay being greater than the fourth predetermined delay.

15. The circuit of claim 14, wherein the third delay circuit comprises:
an NMOS transistor having a gate terminal, a drain terminal, and a source terminal, the gate terminal of the NMOS transistor coupled to the input node of the third delay circuit, and the source terminal of the NMOS transistor coupled to a ground;

a Smith trigger device coupled to the drain terminal of the NMOS transistor; and an RC network coupled to the drain terminal of the NMOS transistor.

16. The circuit of claim 10, further comprising:

a second source follower circuit having an input node and an output node;

a second resistor having a first end and a second end, the first end of the second resistor coupled to the output node of the second source follower circuit; and wherein the negative input node of the first comparator is coupled to the second end of the second resistor and the positive input node is coupled to the second end of the second resistor.

17. The circuit of claim 10, further comprising a first capacitor coupled to the first end of the first resistor and a second capacitor coupled to the second end of the first resistor.

18. The circuit of claim 10, further comprising a first current source coupled to the second end of the first resistor.

19. A method of detecting if an input signal has a signal swing greater than a first predetermined voltage level and a signal frequency within a predetermined frequency band, the method comprising:

generating a first reference signal at a first node of an input stage;

generating a second reference signal at a second node of the input stage;

generating a first comparison output signal in response to the first reference signal and a third reference signal;

generating a second comparison output signal in response to the second reference signal and a fourth reference signal; and generating, by a calibration stage configured to receive the first and second comparison output signals, a detection signal responsive to presence of:

the first comparison output signal having a signal frequency within the predetermined frequency band; and the second comparison output signal having a signal frequency within the predetermined frequency band.

20. The method of claim 19, wherein the generation of the detection signal comprises:

generating a first delayed signal by delaying a falling edge of the first comparison output signal;

generating a second delayed signal by delaying a falling edge of the second comparison output signal; and generating a trigger signal by performing an ADD operation to the a first delayed signal and the second delayed signal.

21. The method of claim 20, wherein the generation of the detection signal further comprises:

generating the detection signal according to the trigger signal.

* * * * *